(12) United States Patent
Hall et al.

(10) Patent No.: US 7,719,070 B2
(45) Date of Patent: May 18, 2010

(54) NON-MAGNETIC SEMICONDUCTOR SPIN TRANSISTOR

(75) Inventors: Kimberley C. Hall, Halifax (CA);
Wayne H. Lau, Goleta, CA (US);
Kenan Gündoğdu, Iowa City, IA (US);
Michael E. Flatté, Iowa City, IA (US);
Thomas F. Boggess, Iowa City, IA (US)

(73) Assignee: University of Iowa Research Foundation, Iowa City, IA (US)

( * ) Notice: Subject to any disclaimer, the term of this patent is extended or adjusted under 35 U.S.C. 154(b) by 0 days.

(21) Appl. No.: 12/351,534

(22) Filed: Jan. 9, 2009

(65) Prior Publication Data

US 2009/0146233 A1    Jun. 11, 2009

Related U.S. Application Data

(63) Continuation of application No. 11/068,562, filed on Feb. 28, 2005, now Pat. No. 7,492,022.

(60) Provisional application No. 60/548,395, filed on Feb. 27, 2004.

(51) Int. Cl.
*H01L 29/82* (2006.01)
(52) U.S. Cl. ............... 257/425; 257/423; 257/427; 257/E29.323; 257/25; 977/935
(58) Field of Classification Search .............. 257/425
See application file for complete search history.

(56) References Cited

U.S. PATENT DOCUMENTS 6,501,143 B2    12/2002    Sato et al.
6,624,490 B2    9/2003    Flatte et al.
6,696,737 B2    2/2004    Flatte et al.
6,753,562 B1    6/2004    Hsu et al.
6,833,598 B2    12/2004    Sato et al.
6,870,717 B2    3/2005    Childress et al.
6,919,213 B2    7/2005    Flatte et al.
6,924,501 B2    8/2005    Komori
7,128,988 B2 *  10/2006    Lambeth ............... 428/831.2
7,492,022 B2    2/2009    Hall et al.

(Continued)

OTHER PUBLICATIONS

U.S. Appl. No. 11/068,562, filed Feb. 28, 2005, Hall, Certificate of Correction—Post Issue Communication, Apr. 21, 2009.

(Continued)

*Primary Examiner*—Jerome Jackson, Jr.
(74) *Attorney, Agent, or Firm*—Ballard Spahr LLP

(57) ABSTRACT

A nonmagnetic semiconductor device which may be utilized as a spin resonant tunnel diode (spin RTD) and spin transistor, in which low applied voltages and/or magnetic fields are used to control the characteristics of spin-polarized current flow. The nonmagnetic semiconductor device exploits the properties of bulk inversion asymmetry (BIA) in (110)-oriented quantum wells.

The nonmagnetic semiconductor device may also be used as a nonmagnetic semiconductor spin valve and a magnetic field sensor. The spin transistor and spin valve may be applied to low-power and/or high-density and/or high-speed logic technologies. The magnetic field sensor may be applied to high-speed hard disk read heads.

The spin RTD of the present invention would be useful for a plurality of semiconductor spintronic devices for spin injection and/or spin detection.

19 Claims, 8 Drawing Sheets

U.S. PATENT DOCUMENTS

| | | |
|---|---|---|
| 2002/0000575 A1 | 1/2002 | Sato et al. |
| 2002/0096698 A1 | 7/2002 | Flatte et al. |
| 2002/0114032 A1 | 8/2002 | Salzman |
| 2003/0062580 A1 | 4/2003 | Sato et al. |
| 2003/0122208 A1 | 7/2003 | Sato et al. |
| 2003/0209770 A1 | 11/2003 | Flatte et al. |
| 2003/0214004 A1 | 11/2003 | Sato et al. |
| 2003/0214763 A1 | 11/2003 | Childress et al. |
| 2004/0124484 A1 | 7/2004 | Sato et al. |
| 2004/0183151 A1 | 9/2004 | Flatte et al. |

OTHER PUBLICATIONS

U.S. Appl. No. 11/068,562, filed Feb. 28, 2005, Hall, Request for Certificate of Correction, Mar. 19, 2009.

U.S. Appl. No. 11/068,562, filed Feb. 28, 2005, Hall, Issue Notification, Jan. 28, 2009.

U.S. Appl. No. 11/068,562, filed Feb. 28, 2005, Hall, Notice of Allowance and Fees Due (PTOL-85), Dec. 3, 2008.

U.S. Appl. No. 11/068,562, filed Feb. 28, 2005, Hall, Amendment/Req. Reconsideration-After Non-Final Reject, Aug. 1, 2008.

U.S. Appl. No. 11/068,562, filed Feb. 28, 2005, Hall, Non-Final Rejection, Mar. 3, 2008.

U.S. Appl. No. 11/068,562, filed Feb. 28, 2005, Hall, Amendment Submitted/Entered with Filing of CPA/RCE, Dec. 14, 2007.

U.S. Appl. No. 11/068,562, filed Feb. 28, 2005, Hall, Advisory Action (PTOL-303), Nov. 19, 2007.

U.S. Appl. No. 11/068,562, filed Feb. 28, 2005, Hall, Amendment After Final, Nov. 7, 2007.

U.S. Appl. No. 11/068,562, filed Feb. 28, 2005, Hall, Final Rejection, Sep. 17, 2007.

U.S. Appl. No. 11/068,562, filed Feb. 28, 2005, Hall, Amendment/Req. Reconsideration-After Non-Final Reject, Jul. 5, 2007.

U.S. Appl. No. 11/068,562, filed Feb. 28, 2005, Hall, Non-Final Rejection, Jan. 5, 2007.

Bir GL, Aronov AG, Pikus GE, "Spin relaxation of electrons scattered by holes," *Zh Eksp Teor Fiz*, 69:1382-1397 (1975); [*Zh Eksp Teor Fiz*, 42:705 (1976)].

Boggess TF, Olesberg JT, Yu C, Flatté ME, Lau WH, *Appl Phys Lett*, 77:1333 (2000).

Bychkov YuA, Rashba EI, "Properties of a 2D electron gas with lifted spectral degeneracy," *JETP Lett*, 39:78-81 (1984).

Chazalviel JN, "Spin relaxation of conduction electrons in $n$-type indium antimonide at low temperature," *Phys Rev B*, 11:1555-1562 (1975).

Chow DH, et al., "Effects of interface stoichiometry on the structural and electronic properties of $Ga_{1-x}In_xSb/InAs$ superlattices," *J Vac Sci Technol B*, 10:888-891 (1992).

D'yakonov MI, Kachorovskii VY, "Spin relaxation of two-dimensional electrons in noncentrosymmetric semiconductors," *Sov Phys Semicond*, 20:110-112 (1986).

D'yakonov MI, Perel VI, "Spin relaxation of conduction electrons in noncentrosymmetric semiconductors," *Sov Phys Solid State*, 13:3023-3026 (1972).

Datta S, Das B, "Electronic analog of the electro-optic modulator," *Appl Phys Lett*, 56:665-667 (1990).

de Andrada e Silva EA, La Rocca GC, "Electron-spin polarization by resonant tunneling," *Phys Rev B*, 59:15583-15585 (1999).

Ebrahimzadeh M, et al., "Low-threshold mid-infrared optical parametric oscillation in periodically poled $LiNbO_3$ synchronously pumped," *Appl Phys B: Lasers Opt*, 72:793-801 (2001).

Elliott RJ, "Theory of the Effect of Spin-Orbit Coupling on Magnetic Resonance in Some Semiconductors," *Phys Rev*, 96:266-279 (1954).

Feenstra RM, et al., "Interface roughness and asymmetry in InAs/GaSb superlattices studied by scanning tunneling microscopy," *Phys Rev Lett*, 72:2749-2752 (1994).

Fiederling R, et al., "Injection and detection of a spin-polarized current in a light-emitting diode," *Nature* (London), 402:787-790 (1999).

Grundler D, "Large Rashba splitting in InAs quantum wells due to electron wave function penetration into the barrier layers," *Phys Rev Lett*, 84:6074-6077 (2000).

Hall KC, Gündoğdu K, Altunkaya E, Lau WH, Flatté ME, Boggess TF, Zinck JJ, Barvosa-Carter WB Skeith SL, "Spin relaxation in (110) and (001) INAs/GaSb superlattices," *Physical Review B*, 68:115311(1-5) (2003).

Hall KC, Gündoğdu K, Altunkaya E, Lau WH, Flatté ME, Boggess TF, Zinck JJ, Barvosa-Carter WB Skeith SL, "Spin relaxation in (110) and (001) INAs/GaSb superlattices," *arXiv:cond-mat/0301080* (2003).

Hall KC, Lau WH, Gündoğdu K, Flatté ME, Boggess TF, "Nonmagnetic semiconductor spin transistor," *Applied Physics Letters* 83(14):2937-2939 (2003).

Hall KC, Lau WH, Gündoğdu K, Flatté ME, Boggess TF, Zink JJ, Barvosa-Carter WB, Skeith SL, "(110)-Oriented 6.1-Å Heterostructures for Spintronic Devices," Department of Physics & Astronomy, Optical Science & Technology Center, University of Iowa, also HRL Laboratories LLC (2003).

Hall KC, Leonard SW, van Driel HM, Kost AR, Selvig E, Chow DH, "Subpicosecond spin relaxation in GaAsSb multiple quantum wells," *Appl Phys Lett*, 75:4156-4158 (1999).

Hallstein S, et al., "Manifestation of coherent spin precession in stimulated semiconductor emission dynamics," *Phys Rev B*, 56:R7076-R7079 (1997).

Hanbicki AT, et al., "Nonvolatile reprogrammable logic elements using hybrid resonant tunneling diode-giant magnetoresistance circuits," *Appl Phys Lett* 79:1190-1192 (2001).

Hoffman CA, et al., "Interface roughness scattering in semiconducting and semimetallic $InAs-Ga_{1-x}In_xSb$ superlattices," *Appl Phys Lett*, 63:2210-2212 (1993).

Kaspi R, "Compositional abruptness at the InAs-on-GaSb interface: optimizing growth by using the Sb desorption signature," *J Cryst Growth*, 201/202:864-867 (1999).

Kaspi R, et al., "As-soak control of the InAs-on-GaSb interface," *J Cryst Growth*, 225:544-549 (2001).

Kikkawa JM, et al., "Resonant Spin Amplification in $n$-Type GaAs," *Phys Rev Lett*, 80:4313-4316 (1998).

Koga T, et al., "Spin-filter device based on the Rashba effect using a nonmagnetic resonant tunneling diode," *Phys Rev Lett*, 88(12):126601(1-4) (2002).

Krebs O, et al., "Giant Optical Anisotropy of Semiconductor Heterostructures with No Common Atom and the Quantum-Confined Pockels Effect," *Phys Rev Lett*, 77:1829-1832 (1996).

Lau WH, Flatté ME, "Effect of interface structure on the optical properties of InAs/GaSb laser active regions," *Appl Phys Lett*, 80:1683-1685 (2002).

Lau WH, Flatté Me, "Tunability of electron spin coherence in III-V quantum-wells," *J Appl Phys*, 91:8682-8684 (2002).

Lau WH, Olesberg JT, "Electron-spin decoherence in bulk and quantum-well zinc-blende semiconductors," Flatté ME, *Phys Rev B*, 64:161301(1-4) (2001).

Lew AY, et al., "Anisotropy and growth-sequence dependence of atomic-scale interface structure in $InAs/Ga_{1-x}In_xSb$ superlattices," *Appl Phys Lett*, 70:75-77 (1997).

Lin Y, "Pedestrian Guide to Spintronics" Power Point presentation, Department of Physics, National Tsing Hua University (Undated Document).

Matsuyama T, et al., "Rashba spin aplitting in inversion layers on $p$-Type bulk InAs," *Phys Rev B*, 61:15588-15591 (2000).

Nikonov D, Bourianoff G, "Spin Transistors Based on Electronic Control of Ferromagnetism," talk at Texas A&M, Apr. 7, 2004.

Nitta J, et al., "Gate Control of Spin-Orbit Interaction in an Inverted $IN_{0.53}GA_{0.47}AS/IN_{0.52}Al_{0.48}As$ Heterostructure," *Phys Rev Lett*, 78:1335-1338 (1997).

Ohno y, et al., "Spin Relaxation in GaAs(110) Quantum Wells," *Phys Rev Lett*, 83:4196-4199 (1999).

Olesberg JT, Lau WH, Flatté ME, Yu C, Altunkaya E, Shaw EM, Hasenberg TC, Boggess TF, "Interface contributions to spin relaxation in a short-period InAn/GaSb superlattice," *Phys Rev B*, 64:201301(1-4) (2001).

Özbay E, et al., "1.7-ps, Microwave, Integrated-Circuit-Compatible InAs/AlSb Resonant Tunneling Diodes," *IEEE Electron Device Lett*, 14:400-402 (1993).

Petukhov AG, et al., "Resonant enhancement of tunneling magnetoresistance in double-barrier magnetic heterostructures," *Phys Rev Lett*, 89:107205 (2002).

Sato Y, et al., "Large spontaneous spin splitting in gate-controlled two-dimensional electron gases at normal $In_{0.75}GA_{0.25}As/In_{0.75}Al_{0.25}As$ Heterojunctions," *J Appl Phys*, 89:8017-8021 (2001).

Söderström JR, et al., "New Negative differential resistance device based on resonant interband tunneling," *Appl Phys Lett*, 55:1094-1096 (1989).

Steinshnider J, et al., "Origin of antimony segregation in GaInSb/InAs strained-layer superlattices," *Phys Rev Lett*, 85:4562-4565 (2000b).

Steinshnider J, et al., "Visualizing interfacial structure at non-common-atom heterojunctions with cross-sectional scanning tunneling microscopy," *Phys Rev Lett*, 85:2953-2956 (2000a).

Tackeuchi A, et al., "Electron spin relaxation in InGaAs/InP multiple-quantum wells," *Appl Phys Lett*, 70:1131-1133 (1997).

Terauchi R, et al., "Carrier Mobility Dependence of Electron Spin Relaxation in GaAs Quantum Wells," *Jpn J Appl Phys Part 1*, 38:2549-2551 (1999).

Ting DZ-Y, Cartoixa X, "Resonant interband tunneling spin filter," *Appl Phys Lett*, 81:4198-4200 (2002).

Tuttle G, et al., "Effects of interface layer sequencing on the transport properties of InAs/AlSb quantum wells: Evidence for antisite donors at the InAs/AlSb interface," *J Appl Phys*, 67:3032-3037 (1990).

Vinattieri A, et al., "Electric field dependence of exciton spin relaxation in GaAs/AlGaAs quantum wells," *Appl Phys Lett*, 63:3164-3166 (1993).

Voskoboynikov A, Liu SS, Lee CP, "Spin-dependent tunneling in double-barrier semiconductor heterostructures," *Phys Rev B*, 59:12514-12520 (1999).

Voskoboynikov, et al., "Spin-polarized electronic current in resonant tunneling heterostructures," *J Appl Phys*, 87:387-391 (2000).

Wagner J, et al., "Observation of extremely long electron-spin-relaxation times in *p*-type delta-doped $GaAs/Al_xGa_{1-x}As$ double heterostructures," *Phys Rev B Condens Matter 47*:4786-4789 (1993).

Wang MW, et al., "Study of interface asymmetry in InAs—GaSb heterojunctions," *J Vac Sci Technol B*, 13:1689-1693 (1995).

Wolf SA, et al., "Spintronics: A Spin-Based Electronics Vision for the Future," *Science*, 294:1488-1495 (2001).

* cited by examiner

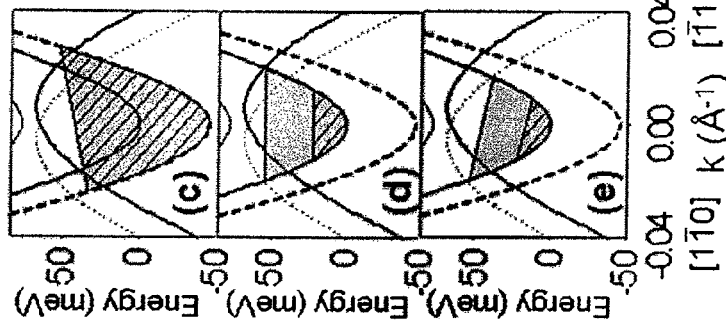
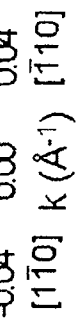
FIG. 8
FIG. 9
FIG. 10
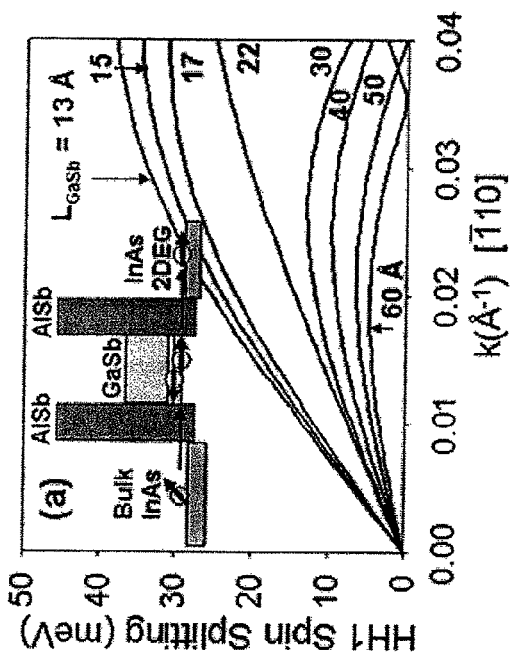
FIG. 6
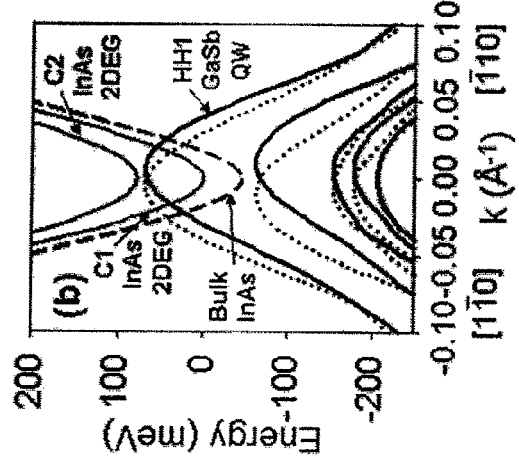
FIG. 7

NON-MAGNETIC SEMICONDUCTOR SPIN TRANSISTOR

CROSS-REFERENCE TO RELATED APPLICATION

This application is a continuation application of and claims benefit of and priority to U.S. patent application Ser. No. 11/068,562 filed on Feb. 28, 2005, now U.S. Pat. No. 7,492,022, which in turn claims benefit of and priority to, U.S. Application No. 60/548,395 entitled "Nonmagnetic Semiconductor Spin Transistor" filed on Feb. 27, 2004, both of which are fully incorporated herein by reference and made a part hereof.

STATEMENT REGARDING FEDERALLY SPONSORED RESEARCH OR DEVELOPMENT

The U.S. Government has a paid-up license in this invention and the right in limited circumstances to require the patent owner to license others on reasonable terms as provided for by the terms of Grant No. DARPA MDA972-01-C-0002 and DARPA/ARO DAAD19-01-1-0490 awarded by The Defense Advanced Research Projects Agency.

BACKGROUND

1. Field

The present invention relates to semiconductor device electronics in the areas of semiconductor-based logic, magnetoresistive devices, and magnetic sensor technology. The present invention includes a spin resonant tunnel diode and spin transistor that operate by controlling spin-polarized current flow using low applied voltages and/or magnetic fields (for magnetic field sensing only), and which are fabricated using traditional III-V semiconductors (i.e. no magnetic materials). These devices represent an improvement over conventional semiconductor device technology.

2. Description of the Related Art

The prospect of developing semiconductor electronic devices that exploit electron spin has motivated a broad research effort into the spin-related properties of semiconductor materials. Semiconductor spintronics has been identified as an emerging research direction for logic applications due to possible improvements in power consumption, which represents a fundamental limitation in scaling for silicon-based CMOS technologies beyond the next decade. Spin-based devices may also be applied to other semiconductor technologies (e.g. memory, optoelectronics, and quantum computation) with the possibility for enhanced performance and functionality (e.g. nonvolatility, high-speed, and high scalability).

Several spintronic device concepts have been proposed; however, the majority of these rely on magnetic metals or magnetic semiconductors (e.g. diluted magnetic or paramagnetic semiconductors). However, devices relying only on nonmagnetic materials are more attractive for practical application because they are more easily integrated into traditional device architectures, and they avoid the complex fabrication issues associated with the incorporation of magnetic materials (e.g. low magnetic solubility, low-temperature growth, conductivity mismatch, interface quality). Devices that avoid magnetic semiconductor materials also offer greater promise for operation at or above room temperature. Furthermore, devices in which the electron spin state is controlled using applied electric fields (rather than external magnetic fields) are favorable because electric fields may be modulated at high rates. Additionally, stray field effects are much less problematic for device operation when only electric fields are used.

An effective approach in developing spin-based semiconductor devices that do not require magnetic materials is to exploit the spin-orbit interaction in traditional III-V semiconductors, by which an electron with a non-zero momentum will experience an electric field also as an effective magnetic field (or pseudomagnetic field). The electric field causing this pseudomagnetic field may originate from a variety of sources, for example, (i) internal electric fields associated with the polar bonds in III-V semiconductors (bulk inversion asymmetry, BIA); or (ii) extrinsic electric fields introduced through asymmetric layer growth, differences in interface potential on two sides of a semiconductor quantum well layer, or the application of an electric bias to a gate above the semiconductor (structural inversion asymmetry, SIA, also known as the Rashba effect). Each of these sources of electric fields contributes to the total pseudomagnetic field experienced by the electrons. In a spin-based device, this pseudomagnetic field may be used to manipulate electron spin dynamically, through the application of a controllable electric field using a gate. One may also design a spin-based device that exploits the energy splitting between electron spin states parallel and antiparallel in relation to the pseudomagnetic field to control spin transport, for example, in a resonant tunnel diode geometry.

In applying the pseudomagnetic field generated by the spin-orbit interaction in a spin-based semiconductor device application, one must take into account the dependence of the pseudomagnetic field orientation on the electron momentum. This pseudomagnetic field structure (which differs in cases (i) and (ii) above) may lead to severe, undesirable design constraints for spin-based semiconductor devices. For the Rashba effect (case (ii)), the Rashba pseudomagnetic field (Rashba field) is oriented in the plane of the heterostructure with a direction that varies with electron momentum. In this case, the Rashba field will cause relaxation of an initially spin-polarized ensemble of electrons by inducing precession, as individual electrons with different momentum directions will experience a different precession axis. This causes a serious trade-off between the size of the Rashba field and the spin relaxation time. Spin manipulation in a practical device requires a strong Rashba field, but a strong Rashba field leads to an extremely short spin relaxation time. Thus, the time interval for spin manipulation is unmanageably short (100 fs-1 ps) when using a strong Rashba field. One may limit device operation to electrons undergoing ballistic transport, in which only a single electron momentum direction is involved, and thereby one relevant pseudomagnetic field orientation; however, this approach leads to considerable fabrication and material challenges as spin manipulation must occur within the electron mean free path.

The Rashba effect may be used for spin manipulation in the ballistic transport regime, as in a proposal proffered by Datta and Das in which spin injection and detection are achieved using ferromagnetic metal contacts (S. Datta and B. Das, Appl. Phys. Lett. 56, 665 (1990)). Also, the Rashba effect may be used in a spin resonant tunnel diode, as in a proposal proffered by Ting et al. that relies on the energy splitting between electron spin states induced by the Rashba pseudomagnetic field (D. Z. Y. Ting and X. Cartoixa, Appl. Phys. Lett. 81, 4198 (2002)). Unfortunately, these devices suffer from the undesirable constraints discussed above.

Accordingly, there is a need for nonmagnetic devices that exploit electric field control over the electron spin for device function without: (i) suffering from a trade off between spin control efficiency and spin relaxation; and (ii) being constrained to ballistic device geometries.

SUMMARY

The present invention encompasses a spin resonant tunnel diode (spin RTD) and a spin transistor that exploit the unique characteristics of a spin-orbit pseudomagnetic field (BIA field) due to bulk inversion asymmetry (BIA) in (110)-oriented heterostructures. These devices are constructed using nonmagnetic materials. The BIA field in (110)-oriented quantum wells has a single orientation for all electron momenta (approximately in the (110) growth direction of the heterostructure) thereby providing a natural quantization axis along which the electron spin states are long lived. For the present invention, a large electron spin splitting due to BIA may be utilized in conjunction with a long spin relaxation time (i.e. the trade off described above for the Rashba effect does not occur). The single orientation of the BIA field also leads to a high sensitivity of the long-lived spin states to an externally applied bias.

The spin RTD of the present invention utilizes the energy splitting between the electron spin states in a (110)-oriented quantum well induced by BIA (BIA spin splitting) to provide spin filtering, and a lateral bias applied using side gate contacts is used to control the spin orientation and magnitude of the spin-polarized current. The spin transistor of the present invention utilizes spin RTDs for both the generation (at an emitter contact) and detection (at a collector contact) of spin-polarized electrons. An electric field is applied to a gate contact above a two-dimensional electron gas (2DEG) residing between the emitter and collector of the spin transistor. The electric field is used to control the size of an emitter-collector spin current by controlling the spin relaxation time in the 2DEG.

The spin RTD is applicable to low-power, high-speed logic circuits, or as a spin injection/detection element in other spin-based devices such as a spin light-emitting diode. The spin transistor is applicable to low-power, high-speed logic circuits, and may also be operated as a spin valve or a magnetic field sensor.

BRIEF DESCRIPTION OF THE DRAWINGS

The foregoing and other advantages and features of the invention will become more apparent from the detailed description of exemplary embodiments of the invention given below with reference to the accompanying drawings.

FIG. 6 is a chart illustrating a BIA spin splitting in a GaSb quantum well versus GaSb thickness;

FIG. 7 is a chart illustrating an overlay of the band structures of a GaSb quantum well, bulk InAs, and an InAs/AlSb quantum well in which the GaSb quantum well, spin up (down) states relative to the (110) growth direction (+z) are indicated by the dotted (solid) curves;

FIG. 8 is a chart containing band structures of FIG. 7 illustrating spin injection in the spin RTD according to the present invention;

FIG. 9 is a chart containing band structures of FIG. 7 illustrating a first configuration for spin detection for the spin RTD according to the present invention;

FIG. 10 is a chart containing the band structures of FIG. 7 illustrating a second configuration for spin detection for a "normally-off" usage of a spin transistor according to the present invention;

DETAILED DESCRIPTION

In the following detailed description, reference is made to the accompanying drawings, which form a part hereof, and in which is shown by way of illustration specific embodiments in which the invention may be practiced. These embodiments are described in sufficient detail to enable those skilled in the art to practice the invention, and it is to be understood that other embodiments may be utilized, and that structural, logical and programming changes may be made without departing from the spirit and scope of the present invention.

Figure 1:
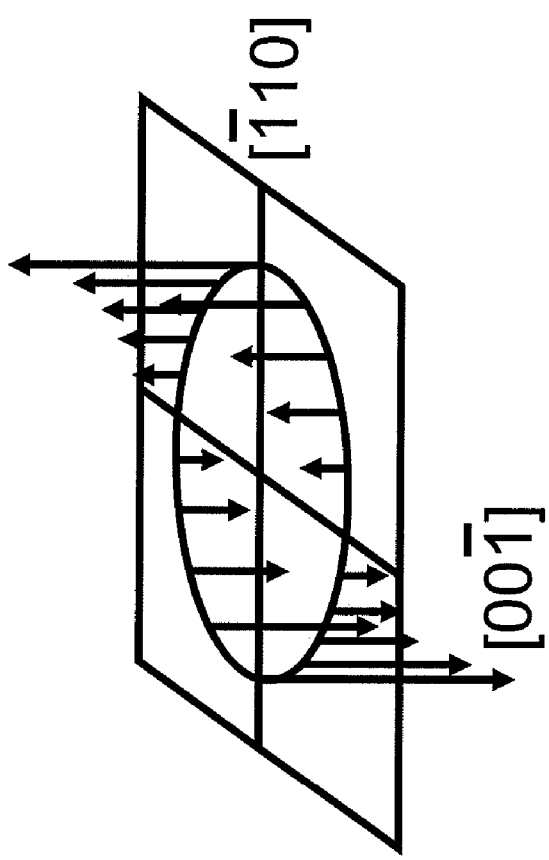
FIG. 1 is a schematic diagram of a BIA pseudomagnetic field in a (110) quantum well.

The present invention utilizes spin-related characteristics associated with (110)-oriented III-V semiconductor heterostructures. In a structurally-symmetric III-V semiconductor quantum well grown in the (110) orientation, a BIA field has a single orientation (nearly aligned with the (110) growth direction) which is independent of the momentum of the electron. A schematic representation of the BIA field in terms of the in-plane wavevector of the electrons in a (110)-oriented quantum well is depicted in FIG. 1. This structure was determined from calculations of the BIA field and electronic structure of a wide range of (110)-oriented III-V semiconductor nanostructures using a 14-band k.p model, which show that a field structure in FIG. 1 applies to both conduction states and valence states (apart from an overall sign change) for a wide range of electron wavevectors (0-0.1 Å$^{-1}$). The salient features of the BIA field are: (a) it has a single alignment axis along the (110) growth direction for all electron wavevectors; and (b) it is oriented in the opposite direction on either side of the [00$\bar{1}$] axis (parallel or antiparallel to (110)). This structure results from the crystal symmetry of III-V semiconductors, together with confinement of electrons in a quantum well in the (110) direction.

Figure 2:
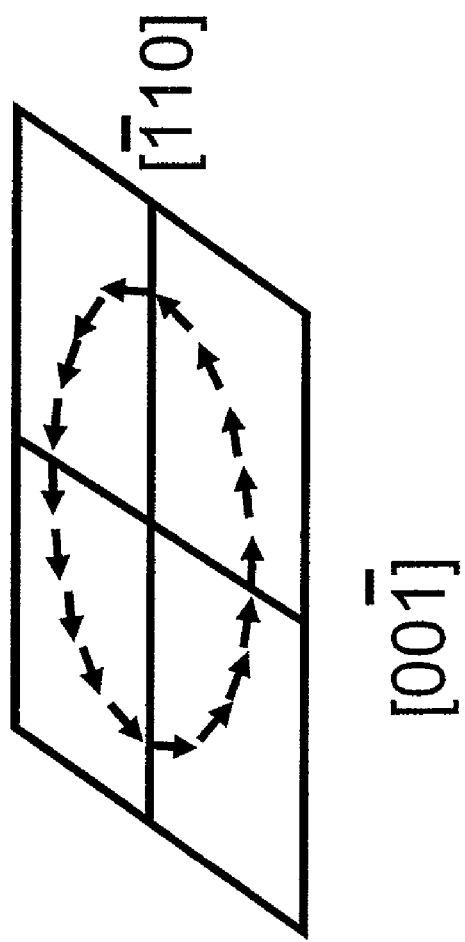
FIG. 2 is a schematic diagram of a Rashba pseudomagnetic field.

Due to a preferential alignment of the BIA field in (110)-oriented quantum wells, the spin relaxation time for spins aligned parallel or antiparallel to the (110) growth direction is very long. In this case, the BIA field may be large in magnitude, leading to a large energy separation between the spin up and spin down states (parallel and antiparallel within the (110) direction, respectively), while maintaining a long spin relaxation time. Thus, by exploiting the structure of the BIA field in (110)-oriented quantum wells, an intrinsic trade off between the spin relaxation time and the spin splitting that exists in heterostructures using a Rashba field is eliminated. This trade-off also exists for the pseudomagnetic field due to BIA in (001)-oriented quantum wells, which has a similar structure to the Rashba field. The Rashba field is depicted schematically in FIG. 2, showing an in-plane structure with no preferred orientation leading to the above-mentioned tradeoff. The spin RTD and spin transistor of the present invention exploit the ability to achieve an enhanced spin relaxation time together with a large spin splitting due to BIA in (110)-oriented quantum wells. These devices thereby provide an improvement over existing semiconductor spintronic device proposals relying on the Rashba effect.

The structure of the BIA field for (110)-oriented quantum wells (FIG. 1) also leads to a high sensitivity of the electron spin relaxation time when an external bias is applied. The application of a bias along the growth direction induces a Rashba field (see FIG. 2), which causes spin relaxation, as described above. Since the BIA field is oriented along the growth direction, the dominant source of spin relaxation for electrons in the (110)-oriented quantum well is the Rashba field. For a zero applied bias, the spin relaxation time is long due to the preferential alignment of the BIA field in (110)-oriented quantum wells and the absence of a Rashba field. For nonzero bias, a large bias produces a large Rashba field, and thereby a short spin relaxation time. As a result, in (110)-oriented semiconductor quantum wells, the spin relaxation time may be controlled over an extremely wide range.

Gate-control of the electron spin relaxation is a basis for state switching in the spin transistor of the present invention, in which a long spin lifetime in the absence of an applied bias leads to a low leakage current. Also, the pronounced sensitivity of the spin relaxation time to an applied bias leads to a low threshold voltage operation. These characteristics provide a reduction in power dissipation relative to silicon-based CMOS transistors.

Semiconductor devices like the spin RTD and spin transistor of the present invention are particularly attractive because these devices are constructed using only nonmagnetic materials. As a result, these devices avoid the complex fabrication issues associated with the incorporation of magnetic materials (e.g. low magnetic solubility, low-temperature growth, conductivity mismatch, interface quality), and avoid the undesirable influence of stray magnetic fields on device operation. As such, the nonmagnetic spin RTD and spin transistor of the present invention would be more easily integrated into traditional device architectures than semiconductor spintronic device proposals that rely on magnetic materials. Furthermore, devices that avoid magnetic semiconductor materials offer greater promise for operation at or above room temperature due to the challenges associated with achieving high ferromagnetic transition temperatures in magnetic semiconductors. In the spin RTD and spin transistor of the present invention, the electron spin state is controlled using applied electric fields (rather than external magnetic fields, with the exception of application of the spin transistor to magnetic field sensing), which is favorable because electric fields may be modulated at high rates. Additionally, stray field effects are much less problematic for device operation when only electric fields are used.

A specific embodiment of this invention is described based on InAs/GaSb/AlSb heterostructures because this system exhibits favorable characteristics, including a large spin-orbit interaction, a large g-factor, a high electron mobility, and the ability to form heterojunctions with large electron barriers; however, devices of the present invention are not limited to the InAs/GaSb/AlSb heterostructures described below. The characteristics of the InAs/GaSb/AlSb heterostructures provide highly favorable performance metrics for the present invention, including large spin filtering efficiency, low leakage current, low threshold voltage, and high magnetic field sensitivity. These performance metrics would permit operation of this invention at or above room temperature, which is an improvement over existing spintronic device proposals. Because InAs/GaSb/AlSb systems have already been applied to ultra-high speed devices based on (traditional) charge current, devices of the present invention provide seamless integration with existing electronic technologies and processing methods. For example, resonant tunnel diodes with switching times ~1 ps have been fabricated for use in microwave integrated circuit applications. Thus, embodiments employing other (110)-oriented III-V semiconductors would be possible. In the case of the spin RTD, an appropriate alignment of bands would be required to permit the realization of resonant tunneling or resonant interband tunneling through BIA-split carrier spin states. In the case of the spin transistor, gate-control of spin relaxation is possible in a wide range of semiconductor materials, but is best applied in materials with a strong spin-orbit interaction to provide the desired low threshold voltage.

Semiconductor Spin Resonant Tunnel Diode

Figure 3:
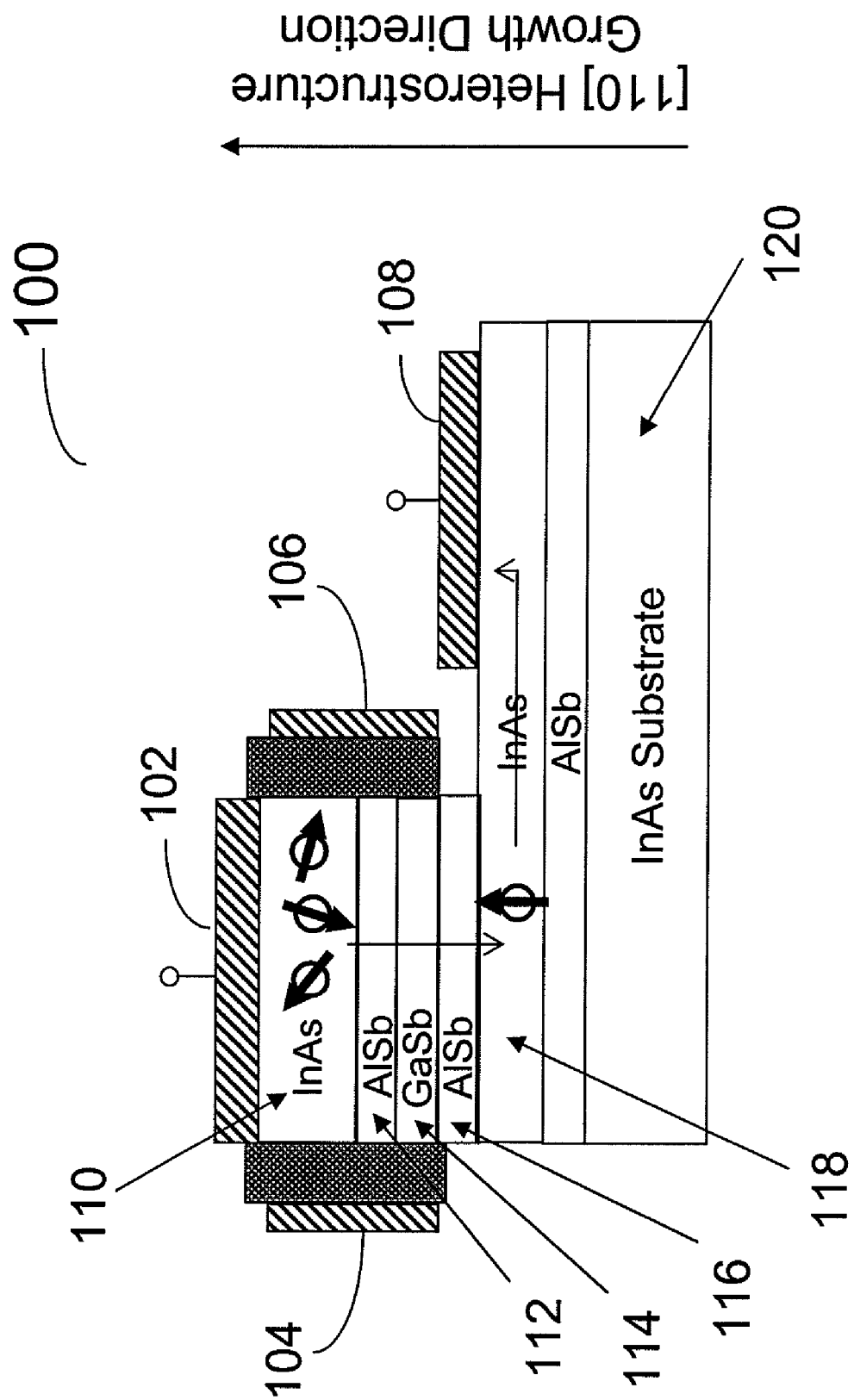
FIG. 3 is a cross-sectional diagram of a nonmagnetic spin resonant tunnel diode (spin RTD) according to the present invention.

FIG. 3 is a cross section of a (110) spin resonant tunnel diode 100 (spin RTD) according to the present invention. The spin RTD 100 may include an emitter connection 102, side gates 104 and 106 for control of the spin current, and a collector contact 108. Configurations of the spin RTD 100 may be possible in which the side gates 104 and 106 are insulating or conducting. The spin RTD 100 has multiple layers, which form a heterostructure. As illustrated, by way of example, the spin RTD 100 includes InAs layers 110 (emitter) and 118 (collector) as well as InAs substrate 120. The spin RTD 100 also includes AlSb layers 112 and 116 (tunnel barriers) and a GaSb layer 114 (quantum well). A band alignment of the spin RTD 100 is depicted in FIG. 4, in which the BIA spin splitting in the heavy hole valence band of the GaSb quantum well is exaggerated for clarity.

Figure 5:
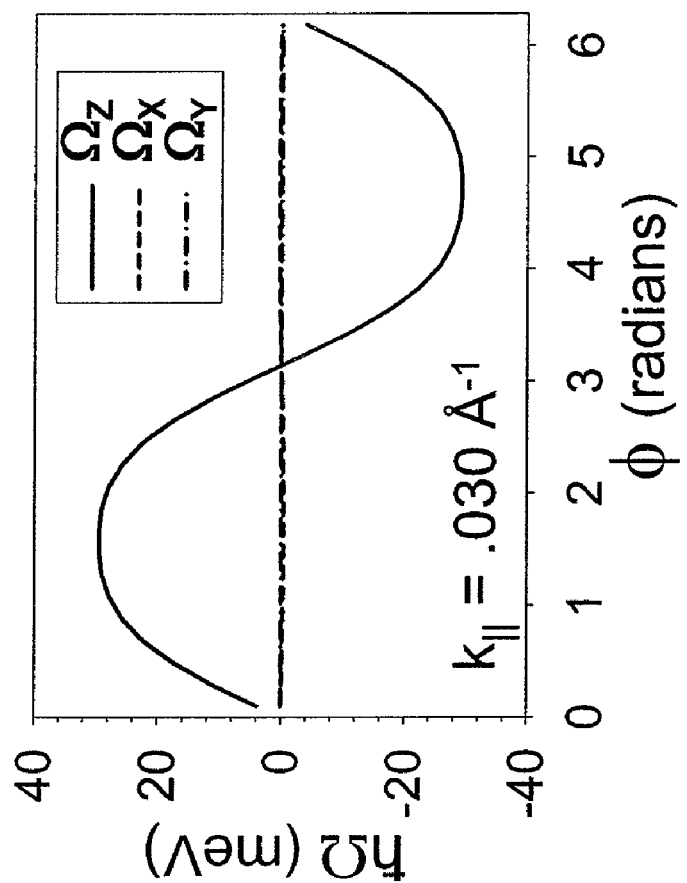
FIG. 5 is a chart illustrating a BIA field for a heavy-hole subband (HH1) in a GaSb quantum well.

A feature of the spin RTD 100 is the exploitation of the BIA field in (110)-oriented symmetric quantum wells. FIG. 5 illustrates the calculated BIA field for the first heavy-hole sub-band in the GaSb quantum well 114 for a fixed in-plane electron wave vector ($k_\parallel$) of 0.03 Å$^{-1}$ versus in plane angle ($\Phi$), where $\Phi=0$ corresponds to the [00$\bar{1}$] direction. The BIA field (FIG. 1, FIG. 5) differs fundamentally from the Rashba field (FIG. 2) since the preferential alignment of the BIA field in the (110) growth direction provides a natural quantization axis for spin. For spin parallel or antiparallel to the (110) growth direction, spin relaxation is suppressed. As a result, the large BIA field in the GaSb quantum well 114 of the spin RTD 100 may be utilized in the absence of significant spin relaxation.

The spin-orbit interaction is very strong in GaSb, and as a result, the BIA field is extremely large in the (110)-oriented GaSb quantum well 114. This corresponds to a large energy splitting between spin states parallel and antiparallel to the BIA field. Accordingly, BIA spin splitting is the basis for spin current generation in spin RTD 100. A large spin splitting is desirable to provide high spin filtering efficiency in the carrier tunneling process. FIG. 6 shows a calculated BIA spin splitting in the GaSb quantum well 114 versus GaSb layer thickness ($L_{AlSb}$=60 Å). The spin splitting in FIG. 6 is large relative to existing predictions or observations in semiconductor systems commonly applied to semiconductor device technology (e.g. GaAs, InAs, and InGaAs). For thin GaSb layers, the spin splitting exceeds 30 meV. This large spin splitting may enable operation of the spin RTD 100 at or above room temperature.

Figure 4:
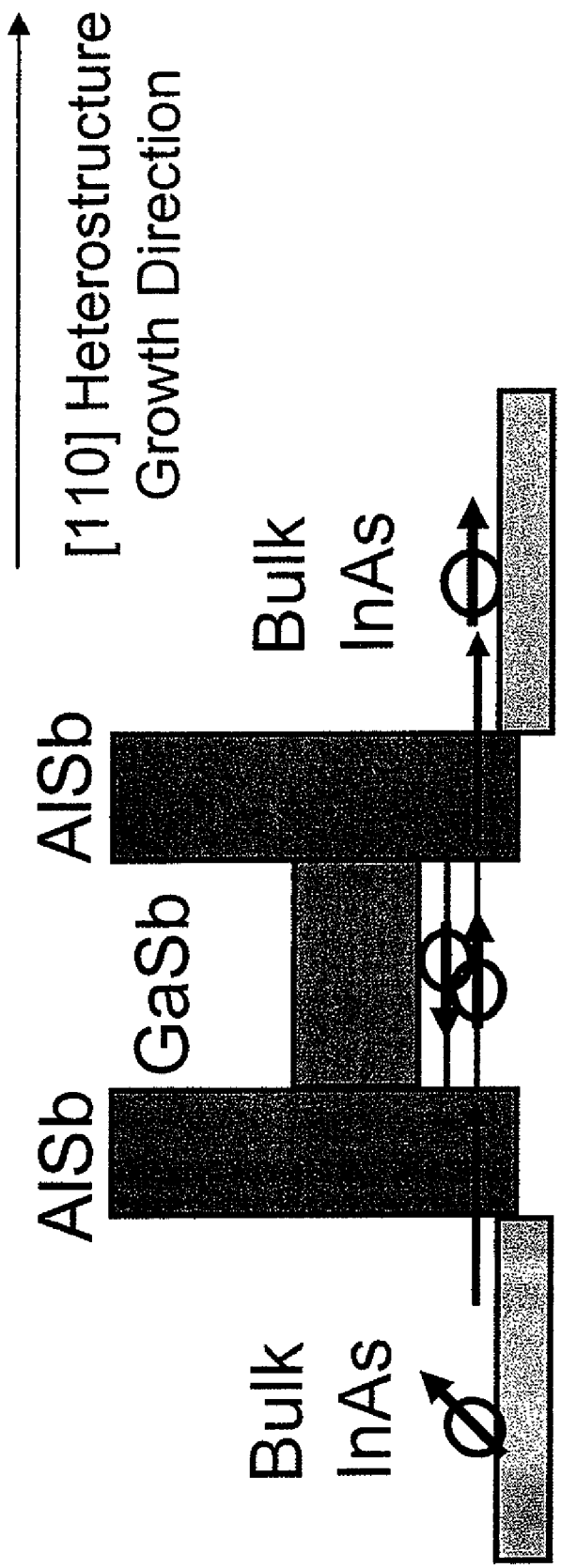
FIG. 4 is a band edge diagram showing band alignment of InAs (emitter), AlSb (barriers), GaSb (quantum well) and InAs 2DEG (collector) in a spin RTD.

As illustrated in FIG. 4, electrons in the conduction band of the InAs emitter 110 (FIG. 3) tunnel through the spin up and/or spin down states of the first heavy hole sub-band (HH1) of the GaSb quantum well 114 to the conduction band of the InAs collector 118 (FIG. 3). ("Spin up" and "spin down" are defined relative to the (110) BIA field direction). This process is called resonant interband tunneling, and is used routinely in conventional (spin independent) RTDs. Because the BIA field reverses sign on either side of the [00$\bar{1}$] axis (FIG. 1, FIG. 5), the application of a lateral bias along [$\bar{1}$10] using side gates 104 and 106 results in spin-polarized current flow. The orientation (spin up or spin down) of the spin current is determined by the sign of the voltage across the side gates (104 relative to 106).

The resonant tunnel process is illustrated in more detail in FIGS. 7-10, which show an overlay of a calculated band structure of GaSb quantum well 114 (indicated by the thick solid curves and the dotted curves) with a conduction band of the bulk InAs emitter 110 and collector 118 (indicated by the dashed line). First (C1) and second (C2) conduction sub-bands of an InAs/AlSb quantum well are also shown in FIGS. 7-10 (indicated by the thin solid curves in FIG. 7). Spin injection into C1 of an InAs quantum well is illustrated (as this is the geometry utilized in the spin transistor of the present invention described below). Injection into a bulk InAs collector 118 (shown in FIG. 3 as an exemplary embodiment) is also possible, and operates in a similar way.

In FIGS. 8-10, Fermi levels for the spin up and spin down electrons are indicated by the shaded and striped regions. Conservation of energy, in-plane momentum, and spin is required for electrons to resonantly tunnel through the structure (FIG. 4). Under the application of a lateral bias to the InAs emitter 110 (FIG. 8) the spins of electrons that resonantly tunnel from the bulk InAs emitter 110 to the InAs/AlSb quantum well 118 (collector) will be aligned with the resonant states in the GaSb quantum well 114 (FIG. 3), and will therefore be oriented up or down relative to the (110) growth direction depending on the sign of the lateral bias applied to the side gates (104 relative to 106), leading to a spin-polarized tunnel current.

Due to the large BIA spin splitting in the (110)-oriented GaSb quantum well 114, highly spin-polarized current injection is achieved with a small applied lateral bias. As shown in FIGS. 7-10, a wavevector displacement of an electron distribution on the order of tens of meV is required, corresponding to an electric field of a few hundred volts per centimeter. The spin RTD 100 is therefore a high fidelity, low voltage spin current source. Furthermore, the spin RTD 100 will be inherently fast due to the nature of tunneling and the thin layers involved (the layers 112-116 are, for example, <100 Angstroms in thickness), as demonstrated in charge-based RTDs based on this material system.

FIGS. 9 and 10 illustrate another use for the spin RTD 100, in which the spin RTD 100 may also be employed for detection of a net spin polarization (i.e. a difference in population between the spin up and spin down electrons) in the first conduction subband of an InAs/AlSb quantum well. The net spin polarization could alternatively be detected in bulk InAs, and would proceed in a similar way. In the geometry illustrated in FIGS. 7-10, the InAs quantum well is an emitter 118 (taking the place of the bulk InAs collector layer 118 in FIG. 3) and the bulk InAs layer 110 is a collector 110. Conservation of carrier spin (in addition to conservation of energy and in-plane momentum) during resonant tunneling leads to a ballistic lateral current in the collector 110 because the conservation condition is only satisfied for electrons on one side of the wavevector plane relative to the [00$\bar{1}$] axis (See FIG. 5 and FIG. 9). This ballistic lateral current will produce a voltage between side gates 104 and 106 across the collector 110, having a magnitude and polarity determined by the spin orientation in the emitter 118. Spin-dependent tunneling occurs if the range of energies between the Fermi levels of the minority and majority spin electrons is in resonance with the BIA-split levels of the GaSb quantum well 114. If no net spin polarization exists in the InAs quantum well, the tunnel current will have equal contributions on both sides of the wavevector plane relative to the [00$\bar{1}$] axis, thereby producing no voltage across the collector side gates 104 and 106. The side gate voltage therefore provides direct detection of spin polarization in the InAs quantum well.

The spin RTD 100 would be useful for a plurality of semiconductor spintronic devices having spin injection and/or spin detection due to the spin RTD 100's large spin splittings, which are associated with BIA in (110)-oriented 6.1 Angstrom semiconductor heterostructures. For example, the growth-direction orientation of the spin tunnel current would be advantageous for spin-based opto-electronic devices, such as a spin light-emitting diode, since this orientation is optimized for the spin-dependent optical selection rules of semiconductor quantum wells. The spin RTD 100 is utilized in the emitter and collector in the spin transistor of the present invention.

Semiconductor Spin Field Effect Transistor

Figure 11:
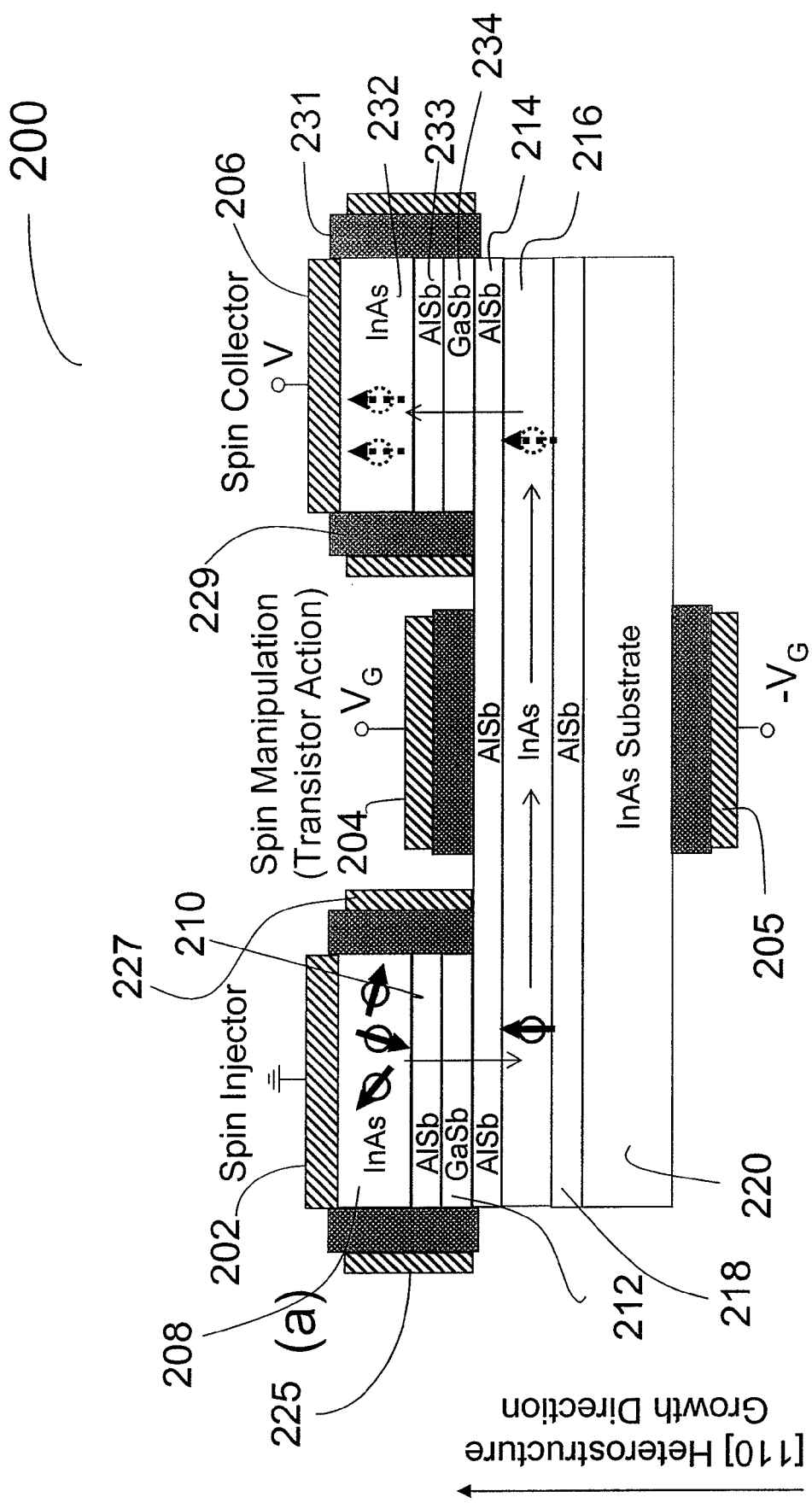
FIG. 11 is a cross sectional diagram of a nonmagnetic semiconductor spin transistor according to the present invention.

FIG. 11 is a cross section of a spin transistor 200 according to the present invention. The spin transistor 200 may include a spin injector connection 202 (emitter), spin manipulation connections 204 (gate) and 205, side gates 225, 227, 229 and 231 and a spin collector connection 206 (collector). The spin transistor 200 has multiple layers which form a heterostructure. As illustrated, by way of example, spin transistor 200 includes InAs layers 208 and 216, as well as InAs substrate 220. The spin transistor also includes AlSb layers 210/233 (210 and 233 originate from the same AlSb layer prior to processing the as-grown heterostructure), 214 and 218, and a GaSb layer 212/234. The AlSb layers 214 and 218 and InAs layer 216 form an InAs/AlSb quantum well, which is referred to as a two-dimensional electron gas (2DEG) hereafter since it may be lightly doped.

The spin transistor 200 utilizes spin-dependent resonant interband tunneling for both spin injection and spin detection (using structures similar to the spin RTD 100), and an electric field applied to the InAs 2DEG 216 (using gate 204) is used to switch states in the spin transistor 200 by switching the spin relaxation time in the InAs 2DEG 216 between high and low values. The spin RTD at the spin injector 202 includes layers 208 (InAs emitter), 210, 214 (AlSb barriers), 212 (GaSb, quantum well), and 216 (InAs 2DEG), with side gates 225 and 227 to control the spin orientation of the injected current using a lateral bias. The spin RTD at the spin collector 206 includes layers 232 (InAs collector), 233, 214 (AlSb barriers), 234 (GaSb, quantum well), and 216 (InAs 2DEG), with side gates 229 and 231 to control the spin filter condition at the spin collector.

Electron spin current is injected into the InAs 2DEG 216 at the spin injector 202 through application of a lateral bias across the side gates (225 relative to 227). The orientation of the spin current (parallel or antiparallel to the (110) growth direction) is determined by the polarity of the side gate bias (225 relative to 227). Because of the large BIA spin splitting in the GaSb quantum well 212 of the RTD used for spin injection, the spin injection current is highly polarized. Application of an emitter-collector bias (between contacts at 202 and 206) causes spin polarized electrons to drift in the InAs 2DEG 216 from the spin injector 202 to the spin collector 206.

Possible modes of spin detection at the spin collector 206 RTD are: 1) the spin state of electrons after they drift across the InAs 2DEG 216 is indicated by the magnitude and polarity of a voltage detected at the side gates across the spin collector 206 (229 relative to 231); in this case the voltage at the side gates across the spin collector 206 may be used as a logical state output for the spin transistor 200; and 2) a lateral bias is applied to the side gates of the spin collector 206 RTD (229 relative to 231), in which case the emitter-collector current is controlled using the relative polarity of the side gate voltages across the spin RTDs in the spin injector 202 (225 relative to 227) and the spin collector 206 (229 relative to 231) and the state of gate 204, which determines the spin relaxation rate in the InAs 2DEG 216. In this case, the emitter-collector current may be a logical state output for the spin transistor 200. For the spin transistor 200 operated in configuration 2), a "normally off" transistor state is obtained by maintaining opposite polarity biases between the spin injector side gates (225 and 227) and the spin collector side gates (229 and 231) shown in FIG. 8 and FIG. 10, and a "normally on" state is obtained by maintaining the same polarity at the spin injector side gates (225 and 227) and spin collector side gates (229 and 231). A small background of spin unpolarized carriers (due to light n-doping, for example $1 \times 10^{-7}$ cm$^{-3}$) may be required to optimize the Fermi level in the InAs 2DEG 216 at the spin collector 206 RTD for spin filtering.

Since both spin transistor 200 configurations (1 and 2) rely on a difference in population between the two spin states within the InAs 2DEG 216, the operation of the spin transistor 200 does not require ballistic transport in the InAs 2DEG 216. This property provides flexibility in the choice of the device dimensions (e.g. the length of the channel).

Figure 12:
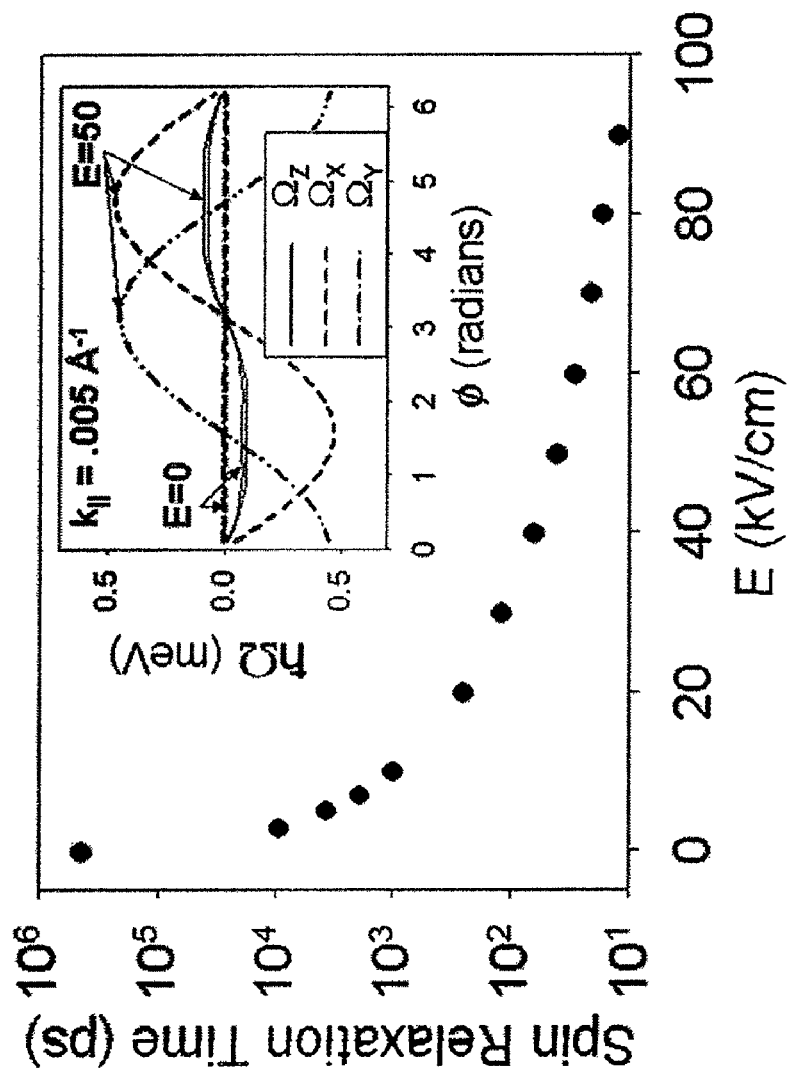
FIG. 12 is a chart illustrating the spin relaxation time (T1) versus electric field strength (E) applied parallel to the (110)-oriented growth direction in an InAs/AlSb quantum well.

FIG. 12 shows a calculated spin relaxation time T1 for electrons in the (110)-oriented InAs/AlSb 2DEG versus electric field strength for a lattice temperature of 77 K. An electric field (E) applied using a bias at gate 204 (relative to 206 or 205) (FIG. 11) is used to control the spin relaxation time in the InAs 2DEG 216. Spin transistor 200 thereby exploits the high sensitivity of the long-lived spin states for an applied E field in the (110) InAs 2DEG 216. For E=0, the spin relaxation time is exceptionally long due to a preferential alignment of the BIA field in the (110) direction, and because the injected electron spins are parallel or antiparallel to the (110) direction. For a nonzero E, a Rashba field is induced (FIG. 12, inset). This Rashba field causes spin relaxation. The larger the bias at gate 204, the shorter the spin relaxation time in the InAs 2DEG 216, as indicated in FIG. 12.

The electron spin relaxation time in the InAs 2DEG 216 and the emitter-collector bias (202 relative to 206) together determine the residual spin polarization of electrons in the InAs 2DEG 216 at the spin collector 206. When spin transistor 200 is operated in configuration 1), for E=0, a significant voltage is detected at the side gates across the spin collector 206 (229 relative to 231). For a large E (T1 is short relative to the emitter to collector transit time), a negligible voltage is detected at the side gates (229 relative to 231) across the spin collector 206. When spin transistor 200 is operated in configuration 2), for E=0 the emitter-collector current will be high for the "normally on" configuration of the RTD side gates (225, 227, 229 and 231) or low for the "normally off" configuration of the RTD side gates (225, 227, 229 and 231). For a large E, the reduction of the residual spin polarization at the spin collector 206 will cause the magnitude of the emitter-collector current to be switched to a lower state (for the "normally on" configuration) or a higher state (for the "normally off" configuration).

Spin transistor 200 may be applied to low-power and/or high-density and/or high-speed logic technologies. In addition, it may be operated as a spin valve or magnetic field sensor, as described below.

Due to strong spin-orbit effects in the InAs 2DEG 216, an application of a weak electric field (using gate 204) leads to a sharp decrease of the spin relaxation time in the InAs 2DEG 216. As illustrated in FIG. 12, T1 falls by more than two orders of magnitude for an E<5 kV/cm. This high sensitivity of the long-lived spin states in the InAs 2DEG 216 to the applied E field (at gate 204), which is caused by the preferential alignment of the BIA field and the strong spin-orbit effects in the InAs 2DEG 216, implies that spin transistor 200 may be operated with a very low threshold gate voltage, providing improvement in power consumption relative to Si-based CMOS technology.

The high spin polarization of the tunnel current at the spin RTDs in the spin injector 202 and spin collector 206 of the spin transistor 200 (due to the large BIA spin splitting in the GaSb quantum wells 212/234) and the absence of a significant spin relaxation during tunneling (due to the preferential alignment of the BIA field) provides improvements in performance relative to Si-based CMOS technology. For example, in spin transistor 200 device configuration 2), the emitter-collector leakage current in the "normally off" configuration for a zero bias at gate 204 is very low, leading to low standby power dissipation.

Furthermore, the high mobility of the InAs 2DEG 216 and the short electron tunnel times in the spin RTDs at the spin injector 202 and the spin collector 206 may allow for high speed operation of the spin transistor 200.

The orientation of the side gates (225, 227, 229 and 231) on the spin RTDs in the spin injector 202 and the spin collector 206 of the spin transistor 200 (which are aligned with [$\bar{1}$10] may be parallel or perpendicular to the electron drift direction in the InAs 2DEG 216. (A parallel case is shown in FIG. 11). Fabrication may be facilitated by the latter approach.

Semiconductor Spin Valve

The spin transistor 200 may be operated as a spin valve (without a need for gate 204). In this application, the emitter-collector resistance is controlled by the relative size and orientation of voltages input to side contacts 225, 227, 229 and 231 across the spin RTDs in the spin injector 202 and the spin collector 206. For a same polarity of a lateral bias across the spin RTD at the spin injector 202 (225 relative to 227) and across the spin RTD at the spin collector 206 (229 relative to 231), the emitter-collector resistance is low. For an opposite polarity of lateral biases at the spin RTDs in the spin injector 202 and spin collector 206, the emitter-collector resistance is high. This behavior relies on the long spin relaxation time in the InAs 2DEG 216, and the high efficiency of spin filtering at the spin RTDs in the spin injector 202 and the spin collector 206, which is associated with the large BIA spin splitting in the GaSb quantum wells 212/234, and minimal spin relaxation during resonant interband tunneling in the spin RTDs. The aforementioned advantages related to spin relaxation are due to the preferential alignment of the BIA field in confined (110) heterostructures.

Operation of spin transistor 200 as a nonmagnetic semiconductor spin valve would be applicable to low-power and/or high density and/or high-speed logic circuits.

Semiconductor-Based Magnetic Field Sensor

The spin transistor 200 may be operated as a magnetic field sensor. A magnetic field perpendicular to the (110) growth direction of spin transistor 200 is measured through characterization of coherent spin precession of the electrons in the InAs 2DEG 216 using a spin-dependent transport functionality of the spin RTDs. In the presence of an external magnetic field (of strength B), electrons in the InAs 2DEG 216 that are injected at the spin injector 202 having spins parallel to the growth direction (spin up or spin down relative to (110), depending on the polarity of the lateral bias across the spin injector side gates 225 and 227) will process as they drift across the InAs 2DEG 216 between the spin injector 202 and the spin collector 206. The rate of precession is g μ$_b$ B/h, where g is the electron g-factor in the 2DEG, μ$_b$ is the Bohr magneton, and h is Planck's constant. In a steady state, the orientation of the spin of the electrons arriving at the spin collector 206, is determined by the size of the magnetic field, the g-factor, the lateral dimension of the channel, and the emitter-collector voltage (202 relative to 206), which determines the speed of electron drift across the InAs 2DEG 216. The magnetic field strength is detected by sweeping the emitter-collector voltage to provide a unit increment in the total number of precession periods for carriers as they travel from the spin injector to the spin collector. This magnetic field detector may be operated in configuration 1), in which case the magnitude and polarity of the voltage across the side contacts on the spin collector (229 relative to 231) indicates the spin state, or in configuration 2), in which case the emitter-collector resistance and the relative polarity of the lateral bias voltages on the emitter and collector together indicate the spin state.

For magnetic field sensor applications, the collector side gates (229 and 231) should extend across the InAs 2DEG 216, which is facilitated by configuring spin transistor 200 to orient the electron drift direction in the InAs 2DEG 216 along [00$\bar{1}$] axis.

The magnetic field sensor exploits the large g-factor of InAs to provide a low threshold for magnetic field detection (in the range of a few gauss). Operation of the spin transistor 200 as a semiconductor-based magnetic field sensor may be applicable to high speed hard disk read heads.

While the invention has been described in detail in connection with exemplary embodiments, it should be understood that the invention is not limited to the above-disclosed embodiments. Rather, the invention can be modified to incorporate any number of variations, alterations, substitutions, or equivalent arrangements not heretofore described, but which are commensurate with the spirit and scope of the invention. Accordingly, the invention is not limited by the foregoing description or drawings, but is only limited by the scope of the appended claims.

We claim:

1. A semiconductor device, comprising:
    a plurality of non-magnetic semiconductor layers, wherein the non-magnetic semiconductor layers form a InAs/GaSb/AlSb heterostructure having a (110)-oriented alignment for a spin orbit BIA field, and wherein said spin orbit BIA field has spin-related characteristics including a single alignment axis along the (110) orientation for electron wavevectors, and said spin orbit BIA field is oriented in the opposite direction on either side of a [00$\bar{1}$] axis (parallel or antiparallel to the (110) orientation); and
    a spin manipulation gate, wherein said spin manipulation gate applies an electric field to one or more of the plurality of non-magnetic semiconductor layers for controlling electron spin current in said heterostructure.

2. The semiconductor device of claim 1, wherein the heterostructure uses (110)-oriented quantum wells.

3. The semiconductor device of claim 2, wherein the BIA field is used to create an energy separation between spin states in the (110)-oriented quantum wells.

4. The semiconductor device of claim 3, wherein BIA spin splitting is used to create a spin polarized current.

5. The semiconductor device of claim 4, wherein the semiconductor device is a spin resonant tunnel diode.

6. The semiconductor device of claim 1 further comprising a spin injector, formed from a portion of the heterostructure, for creating an electron spin in electrons residing in a non-magnetic semiconductor layer in contact with the spin injector; and
    a spin collector, formed from a portion of the heterostructure, for detecting the electron spin in electrons residing in a non-magnetic semiconductor layer in contact with the spin collector.

7. The semiconductor device of claim 6, wherein the semiconductor device is used as a spin valve.

8. The semiconductor device of claim 6, wherein the spin manipulation gate controls electron spin current by controlling electron spin relaxation time.

9. The semiconductor device of claim 8, wherein the emitter and collector layers are formed from at least one spin resonant tunnel diode.

10. The semiconductor device of claim 8, wherein the spin injector, spin collector and spin manipulation gate form a spin transistor.

11. The semiconductor device of claim 10, wherein the spin transistor is used as a magnetic field sensor.

12. The semiconductor device of claim 10, wherein the spin transistor uses a plurality of spin resonant tunnel diodes for generation and detection of spin-polarized electrons.

13. The semiconductor device of claim 10, wherein an electric field is applied to the gate of the spin transistor to control the size of a source-drain spin current through a spin relaxation time for a two-dimensional electron gas.

14. The semiconductor device of claim 6, wherein the semiconductor device uses a BIA field for spin filtering.

15. The semiconductor device of claim 14, wherein the semiconductor device uses a lateral bias to control an orientation and magnitude for a spin-polarized current.

16. The semiconductor device of claim 15, wherein the spin resonant tunnel diode is used as a spin injector for a spin light-emitting diode.

17. A spin transistor comprising:
    a plurality of nonmagnetic semiconductor layers, wherein the nonmagnetic semiconductor layers form a InAs/GaSb/AlSb heterostructure having a preferred alignment for a spin orbit BIA field, and wherein said spin orbit BIA field has spin-related characteristics including a single alignment axis along a (110) orientation for electron wavevectors, and said spin orbit BIA field is oriented in the opposite direction on either side of a [00$\bar{1}$]axis (parallel or antiparallel to the (110) orientation);
    a spin injector, formed from a portion of the heterostructure, for creating an electron spin in electrons residing in a nonmagnetic semiconductor layer in contact with the spin injector;
    a spin collector, formed from a portion of the heterostructure, for detecting the electron spin in electrons residing in a nonmagnetic semiconductor layer in contact with the spin collector; and
    a spin manipulation gate for controlling electron spin polarization of current through the spin transistor.

18. The semiconductor device of claim 17, wherein the spin transistor is used as a spin valve.

19. The spin transistor of claim 17, wherein the spin transistor is used as a magnetic field sensor.

* * * * *